US006068890A

United States Patent [19]

Käumle et al.

[11] Patent Number: 6,068,890

[45] **Date of Patent: *May 30, 2000**

[54] METHOD FOR GLOSS COATING ARTICLES

[75] Inventors: Fritz Käumle, Leonberg; Reinhold Separautzki, Moeglichen; Klaus Goedicke; Fred Fietzke, both of Dresden, all of Germany

[73] Assignee: Dr. Ing. H.C.F. Porsche AG, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/903,746

[22] Filed: Jul. 31, 1997

[30] Foreign Application Priority Data

| | | | |
|---|---|---|---|
| Jul. 31, 1996 | [DE] | Germany | 196 30 818 |
| Jan. 24, 1997 | [DE] | Germany | 197 02 566 |

[51] Int. Cl.$^{7}$ .......... C23C 14/02

[52] U.S. Cl. .......... 427/534; 204/192.14; 204/192.27; 204/192.32; 427/180; 427/294; 427/355; 427/404; 427/535; 427/576

[58] Field of Search .......... 427/576, 404, 427/294, 180, 355, 534, 535; 204/192.27, 192.14, 192.32

[56] References Cited

U.S. PATENT DOCUMENTS

| | | |
|---|---|---|
| 4,598,015 | 7/1986 | Panush . |
| 5,290,625 | 3/1994 | Eisfeller et al. . |
| 5,656,335 | 8/1997 | Schwing et al. . |

FOREIGN PATENT DOCUMENTS

| | | |
|---|---|---|
| 186607 | 7/1986 | European Pat. Off. . |
| 0 525 867 | 2/1993 | European Pat. Off. . |
| 0 684 083 | 11/1995 | European Pat. Off. . |
| 2 154 286 | 5/1973 | France . |
| 2 634 147 | 1/1990 | France . |
| 1 902 607 | 7/1969 | Germany . |
| 81 03 758 | 2/1981 | Germany . |
| 29 52 028 | 6/1981 | Germany . |
| 332476 | 1/1985 | Germany . |
| 3814853 | 11/1988 | Germany . |
| 42 09 406 | 9/1993 | Germany . |
| 42 09 406 A1 | 9/1993 | Germany . |
| 43 25 574 | 2/1995 | Germany . |
| 43 25 574 A1 | 2/1995 | Germany . |
| 4123901 | 4/1992 | Japan . |
| 4131232 | 5/1992 | Japan . |
| 06-227 201 | 8/1994 | Japan . |
| 6227201 | 8/1994 | Japan . |
| 93/19219 | 9/1993 | WIPO . |

OTHER PUBLICATIONS

S. Schiller et al., "Pulsed Magnetron Sputter Technology," published in *Surface and Coatings Technology*, 61 (1993) S. 331–337, International Conference on Metallurgical Coatings and Thin Films, San Diego, California, Apr. 19–23, 1993.

*Primary Examiner*—Bernard Pianalto
*Attorney, Agent, or Firm*—Evenson, McKeown, Edwards & Lenahan, P.L.L.C.

[57] ABSTRACT

The invention relates to a method for gloss coating articles or a portion of an article's surface and articles produced from this method. A corrosion-inhibiting polishing base coat is applied in a known fashion, after which a high-gloss layer produced by atomization, preferably magnetron atomization, is applied. Then, a transparent, wear-resistant top coat layer is applied in a known fashion. The articles can also be pretreated, if desired, and given a protective or other layers. By using this method, parts for vehicles, especially vehicle wheels, can be produced in a great variety of colors and with improved qualities.

17 Claims, No Drawings

METHOD FOR GLOSS COATING ARTICLES

BACKGROUND AND SUMMARY OF THE INVENTION

This application claims the priority of German patent applications 196 30 818.6, filed Jul. 31, 1996, and 197 02 566.8, filed Jan. 24, 1997. The entire contents of both of these disclosures are expressly incorporated herein by reference.

The invention relates to a method for gloss coating articles of manufacture and gloss coated articles produced by the practice of the method. The invention is especially useful in gloss coating vehicle parts, in particular vehicle wheels or rims. The method preferably coats lightweight metal wheels in order to produce a metallic gloss. The method can be used equally well for vehicle parts located both inside and outside the vehicle. In addition, the method can also be used for articles of daily use in a wide variety of applications, in order to produce a special optical effect, to improve the properties of the articles for certain uses, as well as to protect articles from corrosion. Other representative articles include housings for appliances and instruments.

It is known in the art that articles of manufacture, especially vehicle wheels, can be coated by a system of paint layers to protect against corrosion (see, for example, German patent document G 81 03 758 U1, expressly incorporated herein by reference). For example, a pigmented top coat layer is applied to a cathodically deposited electropaint, the top coat layer being cured by electron beams. Another top coat layer, a clear coat, is applied to this layer. The clear coat is also cured by electron beams. The disadvantage of these methods is that only specific glossy metallic colors can be produced.

It is also known in the art that colored layers can be produced on lightweight metal wheels (see, for example, European patent document EP 0 525 867 A1, expressly incorporated herein by reference). For this purpose, a two-layer system is applied with both layers being paint layers. The first layer consists of a paint that contains the primer and the second layer is a transparent coat and contains mica pigments. The disadvantage is that this does not produce a true metallic gloss but merely simulates it by the pigmentation.

It is generally known to deposit layers with different color and gloss effects on objects by vacuum coating, especially by magnetron atomization. In a vacuum chamber, the objects to be coated are placed opposite one or more "targets" that consist of the coating material or a component of the layer to be deposited. A gas discharge is ignited between the target and the objects in such a fashion that a plasma forms and particles of the one or more targets are atomized. Metals, metal alloys, or metal compounds can be used as targets.

Metallic compounds can also be deposited by reactive magnetron atomization, with a metal being atomized and a reactive gas, such as oxygen or nitrogen, being additionally admitted to the vacuum chamber. With a suitable choice of material, possibly in conjunction with a process gas, layers of different colors can be produced on the coated object.

In order to protect layers deposited in this fashion against corrosion and destruction by mechanical wear hard, wear-resistant layers are deposited by PVD and/or CVD (chemical vapor deposition) methods on the glossy metallic layers. The disadvantage of this method is that the protection the layers afford is insufficient to withstand the high mechanical and corrosive stresses to which certain articles are exposed, for example, the stresses vehicle wheels are exposed to. In addition, the manufacture of the protective layers is too expensive.

A goal of this invention is to provide an improved method for gloss coating articles, preferably motor vehicle parts and wheels, that avoids the disadvantages of other methods. In the method of this invention, a plurality of different glossy metallic colors can be produced on the surface of the article or portions thereof. Preferably, vehicle wheels made of metal, especially of lightweight metals or alloys, are coated and preferably coated on their normally visible surfaces. A further goal is to provide a method to gloss coat that results in articles that are resistant to corrosion and can withstand high mechanical stresses. Similarly, a goal of the invention is to provide high-stress resistant gloss coated articles. For example, vehicle wheels that resist mechanical abrasion and chipping. The method is economical, thus, the articles coated by the method should be able to be manufactured or coated economically.

According to certain embodiments of the invention, a method for gloss coating of articles is provided. The articles preferably are for vehicles and especially vehicle wheels. The method is characterized by the following method steps: applying a corrosion-inhibiting polishing base coat; atomizing a high-gloss coat consisting of a metal, a metal alloy, or a metal compound by means of a magnetron in a vacuum, thereby applying a high-gloss coat; applying a transparent wear-resistant top coat, which can comprise a pigment or paint.

In another embodiment, the method comprises a mechanical polishing of the surface of the article, applying a chromate layer, applying a corrosion-inhibiting polishing base coat, applying a high-gloss layer made of a metal, a metal alloy, or a metal compound by means of a magnetron in a vacuum, and applying a transparent wear-resistant top coat consisting of a paint.

A further embodiment of the method comprises mechanical smoothing of the surface of the article, applying a chromate layer; applying a powdered paint layer, applying a corrosion-inhibiting base coat, applying a high-gloss layer made of a metal, a metal alloy, or a metal compound by means of a magnetron in a vacuum, and applying a transparent wear-resistant top layer made of paint.

In specific examples of any of the embodiments of the method, the top coat is applied to the high-gloss layer in a CVD (chemical vapor deposition) process. Furthermore, in any embodiment, a pretreatment may be performed. Pretreatments include heating and/or etching in an inert or reactive gas plasma in the vacuum chamber before the high-gloss layer is applied. Also, pretreatment in the vacuum chamber can be applying an adhesion-promoting layer prior to application of the high-gloss layer. And, a corrosion-inhibiting primer layer, such as a powdered baking finish or like composition, known and used in the art, can also be incorporated into an embodiment of the method.

In any embodiment, the high-gloss layer can be applied by direct-current atomization or pulsed-magnetron atomization of the target material selected in an inert or reactive gas atmosphere. A gas or gas mixture, preferably oxygen, nitrogen, or low-molecular weight hydrocarbon, is admitted as a reactive gas atmosphere. In the atomization process, the article can be moved relative to the targets of the magnetron. Also, the gloss on the articles to be coated can be adjusted by adding pigments to the transparent top coat layer. Numerous appropriate pigments, high-gloss layer compositions, chromate layer compositions, transparent top coat layer compositions, and base coat compositions, as well as other appropriate coating layer compositions, are known in the art and can be used in the practice of the invention or to make the products of the invention. For example, documents such as German patent documents 197 02 566.8 (filed Jan. 24, 1997), 196 30 818.6 (filed Jul. 31, 1996), 81 03 758.9 (dated Feb. 12, 1981), 43 25 574 (dated Feb. 2, 1995), 42 09 406 (dated Sep. 30, 1993), European patent publication 0 525 867 (dated Feb. 3, 1993), U.S.S.R. patent document 221 919, Japanese patent document 6-227201, and the Magnetron-Finishing brochure "Magnetron-Verfahren" of Fraunhofer-Gesellschaft (München; Germany), each incorporated herein by reference, may be relied on by those of skill in the art.

The invention also provides a coated article produced by incorporating any of the methods disclosed. The article may preferably consist of metal or metal alloy, especially a lightweight metal, and have layers applied to it. The layers include a corrosion-inhibiting, polishing paint layer, a high-gloss layer made of a metal, a metal alloy, or metal compound, and a transparent wear-resistant top coat layer made of a paint.

An adhesion-promoting layer can also be applied beneath the high-gloss layer in the article. Or, a chromate layer can be applied beneath the base coat. Alternatively, a powdered paint layer can be applied between the chromate layer and the base coat.

The base coat layer of the article can involve a process-optimized powdered baking finish with a thickness of 100 $\mu$m to 500 $\mu$m, preferably 30 $\mu$m to 300 $\mu$m. In addition, the high-gloss layer can be 10 nm to 5 $\mu$m thick, preferably 100 nm to 500 nm thick.

Specific materials produced as the high-gloss layer include compositions having the following or produced from systems employing the following: titanium, aluminum, and nitrogen; zirconium, aluminum, and nitrogen; and titanium, zirconium, and nitrogen. As described below, each of the metals noted can be used as targets in the magnetron atomization step of the method while in an atmosphere of nitrogen. Various other appropriate metals, targets, atmospheres, compounds, and compositions known in the art can also be used.

Specific materials for use as the top coat can be an organic-inorganic compound, preferably Ormocer, with a thickness of 0.5 $\mu$m to 20 $\mu$m, preferably 2 $\mu$m to 5 $\mu$m. Alternatively, the top coat is an organic layer based on acrylates, or polyurethane or epoxy resin with a thickness of 1 $\mu$m to 100 $\mu$m, preferably 20 $\mu$m to 30 $\mu$m.

According to more specific embodiments of the invention, gloss coatings on parts, especially vehicle wheels and preferably their visible areas, are produced by a combination of several layers. In one embodiment, in a first method step, a corrosion-inhibiting polishing base coat made for example from a process-optimized powdered baking finish or a sputtered paint is applied in a known fashion. Then, in a second method step, a high-gloss layer with a thickness of 10 nm to 5 $\mu$m, preferably 100 nm to 500 nm, is deposited on the parts by magnetron atomization in a vacuum chamber. Depending on the color to be produced, the high-gloss layer is produced by a metal, a metal alloy, or a metal compound. Also depending on the color of the high-gloss layer to be achieved and the coating material used, in other words the target material, the corresponding and/or appropriate version and conditions for magnetron atomization are employed. Significant variations in the method exist, can be devised by those skilled in the art from this disclosure, and specifically include employing a reactive atomization of targets by admitting a reactive gas or reactive gas mixture, for example oxygen, nitrogen, or low-molecular-weight hydrocarbons, and employing a nonreactive atomization, direct-current atomization, or pulsed magnetron atomization, in which the electrical energy is supplied in pulses. In addition, one or more targets can be used, and when several targets are employed, the latter are preferably switched alternately from anode to cathode and from cathode to anode.

Reactive pulsed magnetron sputtering, known in the art, is especially advantageous for making a high-gloss, multi-component layer, such as those consisting of titanium-aluminum-nitride, with simple targets made of titanium and aluminum metal being used in a reactive nitrogen atmosphere. The pulsed magnetron sputtering first permits stable, safe, and reproducible processing not possible with other coating methods because of the electrical sparkovers that frequently occur (so-called arcing). On the other hand, by using purely electrical means, namely the adjustment of the pulses to the length of the pauses, the layer composition and hence the color of the gloss layer can be adjusted and kept constant within wide limits for the targets selected.

In a subsequent method step, a transparent wear-resistant top coat layer is applied to the high-gloss layer in a known fashion. This top coat layer, comprising or based on acrylates, polyurethane, or epoxy resin or consisting of an organic-inorganic compound, preferably Ormocer, has a thickness of 0.5 $\mu$m to 100 $\mu$m.

By combining two known method steps in the application of paint followed by the application of a layer in a vacuum between the two method steps, a layer system can be produced on the article that meets the strict requirements for visual appearance and corrosion protection.

One advantageous embodiment of the gloss coating method of the invention is produced by smoothing the surfaces of the parts, especially the areas to be coated, mechanically before the corrosion-inhibiting glossy base coat is applied and then applying a chromate layer.

It is also advantageous, in another embodiment of the invention, to apply a powdered paint layer to the chromate layer on top of the chromate layer and under the corrosion-inhibiting base coat.

In addition, another advantageous embodiment of the invention consists of applying the top coat layer of paint, as the last in the layer system, on top of the high-gloss layer in a CVD process.

As a result of the atomization step, such as magnetron atomization, layers are produced with visually decorative properties that cannot be produced using conventional painting methods. The variety of colors that can be produced have a metallic gloss, in other words, metallization is not merely simulated by suitable pigmentation. The color palette available extends from dark and light silver through gold and reddish brown to violet. Accordingly, the colors that can be produced on the articles of the invention and by the method of the invention significantly extends the range of previously used colors.

The method employing a system with titanium-aluminum-nitrogen has proven especially advantageous. For example, aluminum and titanium are used as targets in the magnetron atomization in a chamber having nitrogen as the reactive atmosphere. A great many different colors can be produced with this method alone. However, there are other systems, zirconium-aluminum-nitrogen and titanium-zirconium-nitrogen for example, that can be used to make other colors. Still other colors can be produced by using copper or brass.

Moreover, application of the high-gloss layer by magnetron atomization is a simple and economical process. The result is a good coating on all sides of three-dimensional, complex-shaped articles that cannot be achieved with other vacuum coating methods, such as electron beam evaporation, arc evaporation, evaporation from boats, or ionic plating.

Another advantage consists of the fact that by using the method of the invention, the relatively sensitive high-gloss layer protects against major stresses and/or environmental factors, such as attack by alkalis and acids. The elasticity of the relatively thick base coat and top coat layers is largely responsible for the resistant qualities of the coat, which can offset mechanical stresses such as chipping and abrasion. In addition, the invention provides corrosion protected articles by the base coat while smoothing out surface roughnesses, like those surfaces found on forged or cast lightweight metal wheels. In this way, a smooth surface is created for subsequent coating with the high-gloss layer and the adhesion strength of this layer is improved.

By employing additives in the transparent top coat layer, it is also possible to precisely adjust the gloss of the gloss coating so that several gradations of gloss are obtained that meet aesthetic and style requirements.

Additional advantageous embodiments of the invention include mechanically smoothing the surface before the base coat is applied. The adhesion of the high-gloss layer is also improved if pretreatment by heating and/or etching is performed prior to the application of this layer, in an inert or reactive gas plasma or by applying an adhesion-promoting layer.

It may be advantageous to coat only the visible areas of articles, such as the visible portions of a lightweight metal wheel as it is used, rather than the entire surface. This reduces the coating cost.

The method proposed for gloss coating can be used to coat parts made of steel and lightweight metals, such as magnesium, titanium, aluminum, and their alloys, as well as plastics. Typical vehicle parts made from these materials include mirror housings, fan grates, radiator grilles, door latches, operating buttons, instrument panel parts, and the like. All of the vehicle interior and exterior parts can be given a gloss coating. These parts can be cast parts, injection-molded parts, or plastic or sheet metal parts that may be assembled. During the coating of plastic parts, special conditions can be taken into account, especially when applying the high-gloss layer and during possible initial glow cleaning, by adjusting the process parameters as known to one skilled in the art and through the teachings herein.

The invention will now be described in greater detail with reference to one embodiment in several variations. Other objects, advantages and novel features of the present invention will become apparent from the detailed description.

DETAILED DESCRIPTION OF SPECIFIC EMBODIMENTS OF THE INVENTION

A vehicle wheel made of a lightweight metal, such as Al, Mg, or Ti, is to be given a glossy violet coating, primarily in the vicinity of the wheel spider. For this purpose, the vehicle wheel, after being mechanically polished, is coated in a first step in a fashion known in the art with a process-optimized powdered baking finish.

Then in a second step, the vehicle wheel is placed in a vacuum chamber in such a fashion that the exterior of the vehicle wheel is located opposite two targets of the magnetron atomization sources located in the vacuum chamber. One target is made of aluminum and the other of titanium. After the vacuum chamber has been evacuated, argon is admitted into the vacuum chamber and a glow discharge is ignited in this inert gas atmosphere. The high-gloss layer is applied in known fashion by pulsed magnetron atomization. The aluminum and titanium targets are operated alternately as the anode and cathode of the glow discharge at a frequency of 10 kHz. The total power supplied to the targets is 15 kW. In addition, 80 sccm of nitrogen are admitted as a reactive gas to the vacuum chamber, so that a working pressure of $2\times10^{-3}$ mbar is set. To produce a uniform coating, the vehicle wheel is rotated around its axis of symmetry during coating. During the coating time of three minutes, a high-gloss violet layer 200 nm thick is deposited on the vehicle wheel.

In a third step, a top coat layer based on polyurethane and 30 $\mu$m thick is applied to the high-gloss layer in a fashion known in the art.

If the article, the vehicle wheel in the present example, is made of magnesium, it is advantageous to perform the mechanical polishing that precedes the application of the layer system as so-called smooth grinding. This method, however, can also be advantageous for parts made of other materials in order to remove impurities from the surface that would otherwise have an unfavorable influence on the quality of the coating.

The above method can also be advantageously designed to use a chromate layer as a first layer after mechanical polishing and to apply a powdered paint coating on top. The chromate layer is preferably applied chemically and has the particular purpose of having a corrosion-inhibiting effect, with the base coat having a reduced action as an additional corrosion-inhibiting layer. The powdered paint layer forms a plastic resistance against external influences such as chips on vehicle wheels.

Although the invention has been described in detail, it is to be clearly understood that the description is merely illustrative and is not to be taken as a limitation of the scope of the invention. While the methods can be used on vehicles wheels as exemplified, many other articles can be coated similarly and through the variations discussed or known in the art to apply. Thus, the coated articles of the invention include vehicle wheels and other vehicle parts as well as any other article amenable to receiving a gloss coating. The spirit and scope of the present invention are to be limited only by the terms of the appended claims.

We claim:

1. A method for gloss coating at least a portion of the surface of an article, comprising:

applying a corrosion-inhibiting base coat to the article;

atomizing a target selected from the group consisting of a metal, a metal alloy, and a metal compound using a magnetron in a vacuum, thereby applying a high-gloss coat on the corrosion-inhibiting base coat; and applying a transparent, wear-resistant top coat to the high-gloss coat.

2. The method according to claim 1, further comprising applying a corrosion-inhibiting primer paint layer made of a powdered stoving paint after said applying of the paint powder layer.

3. A method according to claim 1, wherein pigments are added to the transparent top coat layer.

4. A method according to claim 1, wherein the top coat is applied in a CVD process.

5. A method according to claim 1, further comprising pretreating the article in a vacuum before the high-gloss layer is applied, wherein the pretreatment comprises heating and/or etching in an inert or reactive gas plasma.

6. A method according to claim 1, further comprising pretreating the article in a vacuum before the high-gloss layer is applied, wherein the pretreatment comprises applying an adhesion-promoting layer.

7. A method according to claim 1, further comprising moving the article relative to targets of the magnetron.

8. A method according to claim 1, further comprising adding a gas or gas mixture comprising one or more of oxygen, nitrogen, or a low-molecular weight hydrocarbon, to the vacuum.

9. A method for gloss coating at least a portion of the surface of an article, comprising:

providing an article;

applying a chromate layer to the article;

applying a corrosion-inhibiting base coat to the chromate layer;

applying a high-gloss layer comprising a metal, a metal alloy, or a metal compound using a magnetron in a vacuum to the base coat; and applying a transparent wear-resistant top coat comprising a pigment or paint to the high-gloss layer.

10. A method according to claim 2, wherein the high-gloss layer is applied by direct-current atomization or pulsed-magnetron atomization in an inert or reactive gas atmosphere.

11. A method for gloss coating at least a portion of the surface of an article, comprising:

providing an article;

applying a chromate layer to the article;

applying a powdered paint layer to the chromate layer;

applying a corrosion-inhibiting base coat to the powdered paint layer;

applying a high-gloss layer comprising a metal, a metal alloy, or a metal compound using a magnetron in a vacuum to the corrosion-inhibiting base coat; and applying a transparent wear-resistant top coat comprising a pigment or paint to the high-gloss layer.

12. A method for gloss coating of a part by application of a layer system comprising:

providing a part;

applying a chromate layer to the surface of the part;

applying a paint powder layer to the chromate layer;

sputtering a target selected from the group consisting of a metal alloy and a metal compound by means of a magnetron in a vacuum, thereby applying a high-gloss coat on the paint powder layer; and applying a transparent, wear-resistant coating paint layer to the high-gloss layer.

13. The method according to claim 12, wherein said parts are parts for vehicles.

14. The method according to claim 13, wherein said parts for vehicles are wheels.

15. A method for gloss coating at least a portion of the surface of an article, comprising:

providing an article;

mechanically smoothening the article or a portion of the surface of the article;

applying a chromate layer to the article;

applying a corrosion-inhibiting base coat to the chromate layer;

applying a high-gloss layer comprising a metal, a metal alloy, or a metal compound using a magnetron in a vacuum to the base coat; and applying a transparent wear-resistant top coat comprising a pigment or paint to the high-gloss layer.

16. A method for gloss coating at least a portion of the surface of an article, comprising:

providing an article;

mechanically smoothening the article or at least a portion of the surface of the article;

applying a chromate layer to the article;

applying a powdered paint layer to the chromate layer;

applying a corrosion-inhibiting base coat to the powdered paint layer;

applying a high-gloss layer comprising a metal, a metal alloy, or a metal compound using a magnetron in a vacuum to the corrosion-inhibiting base coat; and applying a transparent wear-resistant top coat comprising a pigment or paint to the high-gloss layer.

17. A method for gloss coating of a part by application of a layer system comprising:

providing a part;

mechanically smoothening a surface of the part;

applying a chromate layer to the surface of the part;

applying a paint powder layer to the chromate layer;

sputtering a target selected from the group consisting of a metal alloy and a metal compound by means of a magnetron in a vacuum, thereby applying a high-gloss coat on the paint powder layer; and applying a transparent, wear-resistant coating paint layer to the high-gloss layer.

* * * * *